United States Patent [19]
Risch et al.

[11] Patent Number: 5,744,393
[45] Date of Patent: Apr. 28, 1998

[54] METHOD FOR PRODUCTION OF A READ-ONLY-MEMORY CELL ARRANGEMENT HAVING VERTICAL MOS TRANSISTORS

[75] Inventors: Lothar Risch, Neubiberg; Franz Hofmann; Wolfgang Rösner, both of München; Wolfgang Krautschneider, Hohenthann, all of Germany

[73] Assignee: Siemens Aktiengesellschaft, Munich, Germany

[21] Appl. No.: 836,175

[22] PCT Filed: Oct. 5, 1995

[86] PCT No.: PCT/DE95/01365

§ 371 Date: Apr. 17, 1997

§ 102(e) Date: Apr. 17, 1997

[87] PCT Pub. No.: WO96/13064

PCT Pub. Date: May 2, 1996

[30] Foreign Application Priority Data

Oct. 20, 1994 [DE] Germany ............... 44 37 581.6

[51] Int. Cl.⁶ .................................... H01L 21/8246
[52] U.S. Cl. .................. 438/275; 438/276; 438/278; 438/206
[58] Field of Search .................. 438/275, 276, 438/278, 206

[56] References Cited

U.S. PATENT DOCUMENTS

| 4,663,644 | 5/1987 | Shimizu . | |
|---|---|---|---|
| 5,021,355 | 6/1991 | Dhong et al. . | |
| 5,362,662 | 11/1994 | Ando et al. | 438/278 |
| 5,378,649 | 1/1995 | Huang | 438/278 |
| 5,429,973 | 7/1995 | Hong | 438/275 |

FOREIGN PATENT DOCUMENTS 35 27 502 A1  2/1986  Germany .

*Primary Examiner*—Jey Tsai
*Attorney, Agent, or Firm*—Hill & Simpson

[57] ABSTRACT

A method for production of a read-only-memory cell arrangement having vertical MOS transistors is provided. In order to produce a read-only-memory cell arrangement which has first memory cells having a vertical MOS transistor and second memory cells which do not have a vertical MOS transistor, holes provided with a gate dielectric and a gate electrode are etched in a silicon substrate with a layer sequencing corresponding to a source, a channel and a drain for the first memory cells. Insulation trenches whose separation is preferably equal to their width are produced for insulation of adjacent memory cells.

9 Claims, 4 Drawing Sheets

METHOD FOR PRODUCTION OF A READ-ONLY-MEMORY CELL ARRANGEMENT HAVING VERTICAL MOS TRANSISTORS

BACKGROUND OF THE INVENTION

Memories in which data are permanently written in digital form are required for many electronic systems. Such memories are called, inter alia, read-only-memories.

For large quantities of data, such as, in particular, the digital storage of music, plastic discs, so-called compact discs which are coated with aluminium, are in widespread use as read-only-memories. These disks have two types of point-like depressions in the coating, which depressions are assigned to the logic values zero and one. The information is stored digitally in the arrangement of these depressions.

In order to read the data which are stored on a compact disc, the disc is mechanically rotated in a read apparatus. The point-like depressions are scanned via a laser diode and a photocell. Typical scanning rates in this case are 2×40 kHz. Approximately 4 Gbits of information can be stored on one plastic disc.

The read apparatus has moving parts which wear mechanically, require a comparatively large volume and allow only slow data access. Furthermore, the read apparatus is sensitive to vibration and is thus suitable for mobile systems only to a limited extent.

Read-only-memories on a semiconductor basis, preferably silicon, are in widespread use for the storage of smaller quantities of data. These are generally implemented as a planar integrated silicon circuit in which MOS transistors are used as memory cells. During read-out, the individual memory cells are selected via the gate electrode of the MOS transistors, which is connected to a word line. The input of each MOS transistor is connected to a reference line, and the output is connected to a bit line. During the read process, an assessment is carried out as to whether any current is or is not flowing through the transistor. The logic values zero and one are assigned accordingly.

Technically, the storage of zero and one in the case of these read-only-memories is brought about by no MOS transistor being produced in memory cells in which the logic value assigned to the state "no current flow through the transistor" is stored, or no conductive connection to the bit line being implemented. Alternatively, the two logic values can be implemented by means of MOS transistors which have different operating voltages as a result of different implantations in the channel region.

These known silicon memories generally have a planar construction. In consequence, a minimum area requirement, which is approximately 6 to 8 $F^2$, is required per memory cell wherein F is the smallest structure size which can be produced in the respective technology. Planar silicon read-only-memories are thus limited to memory densities of about 0.14 bit/$\mu m^2$ using one-$\mu m$ technology.

U.S. Pat. No. 5,021,355 discloses a read-only-memory having vertical MOS transistors. A p-well is produced in an n-doped substrate in order to produce this read-only-memory. An n-doped drain region is produced on the surface of the p-well. Trenches which extend into the p-well are etched for formation of vertical MOS transistors. A source region, which can extend to and abut the n-doped substrate is formed on the base of the trenches by implantation. A channel region is arranged along the flanks of the trench. The surface of the trench is provided with a gate dielectric. The trench is filled with a gate electrode. Adjacent memory cells are insulated from one another by flat insulation regions, which cut through the drain regions and extend into the p-well. Zero and one are distinguished in this arrangement by no trench being etched, and no transistor produced, for one of the logic values.

SUMMARY OF THE INVENTION

The present invention is based on the problem of specifying a method for production of a read-only-memory cell arrangement on a semiconductor basis, by means of which read-only-memory cell arrangements having an increased memory density are achieved and in the case of which a high yield is ensured.

To this end, in an embodiment, the present invention provides a method for production of a read-only-memory cell arrangement. The method comprises the steps of: forming a cell field on a main surface of a semiconductor substrate wherein the cell field has first memory cells in which a first logic value is stored and which have at least one MOS transistor which is vertical with respect to the main surface. The cell field has second memory cells in which a second logic value is stored and which do not comprise a MOS transistor; doping the semiconductor substrate by a first conductance type provided with a first doped region which is doped by a second conductance type, opposite to the first, and abuts the main surface in the area of the cell. A plurality of insulation trenches are produced which run essentially parallel in the form of strips that extend from the main surface through the first doped region into the semiconductor substrate. A second region is produced which is doped by a first conductance type having a shallower depth than the first doped region abutting the main surface. Opening holes are opened wherein the holes extend from the main surface through the first doped region into the semiconductor substrate to overlap the boundary surface between one of the insulation trenches and the adjacent part of the second doped region whose surface is provided with a gate dielectric and a gate electrode.

In an embodiment, insulation trenches are produced at such intervals and with such widths that the distance between adjacent insulation trenches is essentially equal to the width of the insulation trenches.

In an embodiment, holes are produced with a cross-section parallel to the main surface with linear dimensions essentially equal to the width of the insulation trenches. A center is arranged offset with respect to a center of the insulation trenches.

In an embodiment, a center point of the cross-section of the holes is arranged offset by approximately half the width of the insulation trenches with respect to the center of the insulation trenches.

In an embodiment, trenches filled with insulating material are etched in an anisotropic dry-etching process using a trench mask for formation of the insulation trenches.

In an embodiment, the surface of the second doped region is provided with an insulating layer in the cell field.

In an embodiment, a double layer of $SiO_2$ and $Si_3N_4$ is applied to the main surface over the entire area. The double layer is removed in the region of the cell field after the implantation for formation of the second doped regions. An insulating layer is formed on the surface of the second doped region by thermal oxidation wherein any oxidation of the surface outside of the cell field is prevented by the double layer. The double layer is removed after formation of the insulating layer.

In an embodiment, etching is performed that attacks silicon selectively with respect to $SiO_2$ in the region of the cell field before the application of the double layer.

In an embodiment, a gate oxide layer is formed for MOS transistors formed in a periphery outside the cell field during thermal oxidation for formation of the gate oxide, and the conductive layer is structured such that gate electrodes for the MOS transistors are formed at the same time in the periphery.

In an embodiment, flanks of the gate electrode of the MOS transistors in the periphery are provided with flank insulations. Source-drain regions are formed for the MOS transistors in the periphery wherein the gate electrodes which are provided with flank insulations are used as a mask.

In the method according to the invention, a read-only-memory cell arrangement is produced which has first memory cells and second memory cells. The first memory cells, in which a first logic value is stored, are implemented by a MOS transistor which is vertical with respect to the main surface. The second memory cells, in which a second logic value is stored, are implemented by no MOS transistor being formed.

In order to produce the read-only-memory cell arrangement, a first doped region and a second doped region are produced in a silicon substrate which is doped by a first conductivity type. The first doped region is doped by a second conductivity type, which is opposite to the first and extends over the entire cell field. The first doped region can be formed both as an appropriately extended well and as a continuous layer over the entire substrate. The second doped region is doped by the first conductivity type and abuts the main surface of the substrate.

A plurality of insulation trenches, which run essentially parallel, are produced. The insulation trenches have a cross-section in the form of strips parallel to the main surface and run over the entire cell field. The insulation trenches extend from the main surface into the substrate which is doped by the first conductivity type.

Holes which extend from the main surface through the first doped region into the substrate which is doped by the first conductivity type are opened in order to produce the first memory cells. The surface of the holes is provided with a gate dielectric and a gate electrode. The second doped region, the first doped region and the substrate in this case act as the drain, channel and source.

In order to produce the second memory cells, no hole is etched at the appropriate points.

The memory cells are preferably arranged in rows and columns. One insulation trench is in each case arranged between each two columns. Word lines, to which the gate electrodes are connected, run transversely with respect to the insulation trenches. The second doped regions, which in each case run between adjacent insulation trenches, and parallel to the insulation trenches, are used as bit lines. The substrate represents a common line via which an operating voltage is applied.

A substrate of monocrystalline silicon is preferably used as the semiconductor substrate.

The holes for formation of the vertical MOS transistors are in each case preferably arranged such that they overlap the boundary surface between one of the insulation trenches and the adjacent part of the second doped region. In consequence, the arrangement can be produced with a greater packing density.

It is particularly advantageous for the insulation trenches to be produced at such intervals and with such widths that the distance between adjacent insulation trenches is essentially equal to the width of the insulation trenches. At the same time, the holes are produced with a cross-section parallel to the main surface, the linear dimensions of which cross-section are essentially equal to the width of the insulation trenches. This means that the holes are produced, for example, in square form with a side length corresponding to the width of the insulation trenches, or in round form with a diameter corresponding to the width of the insulation trenches. The center point of the cross-section of the holes is arranged offset with respect to the center of the insulation trenches in this case.

If, in this embodiment, the width of the insulation trenches is produced equal to the smallest structure size F which can be produced in the technology used, then the area requirement of a memory cell is 4 $F^2$. This embodiment of the invention makes use of the fact that the adjustment accuracy is always better than the smallest structure size F which can be produced. A memory cell having an area of 4 $\mu m^2$ can thus be produced using 1-μm technology. Memory densities of 0.25 bit/$\mu m^2$ are thus achieved. The read-only-memory cell arrangement produced according to the invention is thus suitable for the storage of large quantities of data. It is thus an attractive alternative to a conventional compact disc memory, since the arrangement according to the invention allows random access to the stored information since it does not require any mechanical drive for read-out and thus requires less electrical power, and since it can also be used for mobile systems.

When producing a memory cell arrangement having 4 $F^2$ memory cells, it is advantageous to arrange the holes offset by approximately half the width of the insulation trenches with respect to the center of the insulation trenches since the insulation between adjacent memory cells is then maximized.

It is within the context of the invention to form MOS transistors, for driving the memory cell arrangement, in the periphery on the substrate at the same time during the production of the cell field of the memory cell arrangement. The gate oxide and the gate electrodes of the MOS transistors in the periphery can in this case be formed in the same process steps as the gate oxide and the gate electrodes in the cell field.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
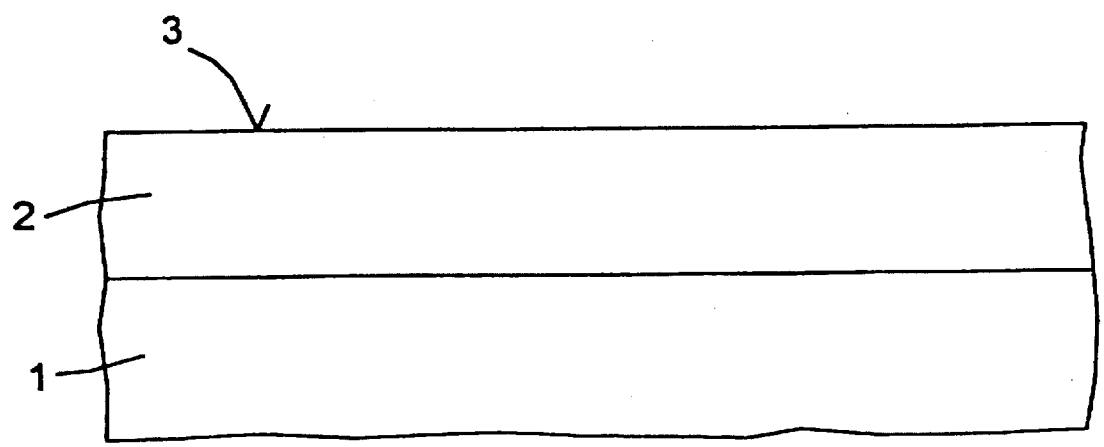
FIG. 1 illustrates a substrate having a first doped region.

A first doped region 2 is produced on a substrate 1 of, for example, n-doped monocrystalline silicon having a dopant concentration of $1 \times 10^{19}$ cm$^{-3}$. The first doped region 2 is, for example, p-doped with a dopant concentration of, for example, $5 \times 10^{16}$ cm$^{-3}$ (see FIG. 1). The first doped region 2 is produced, for example, by implantation over the entire area or masked implantation with boron, or by growth of an in-situ p-doped layer by means of CVD epitaxy. The first doped region 2 comprises a main surface 3. The first doped region 2 has a thickness of, for example, 0.5 µm to 1 µm at right angles to the main surface 3.

Figure 2:
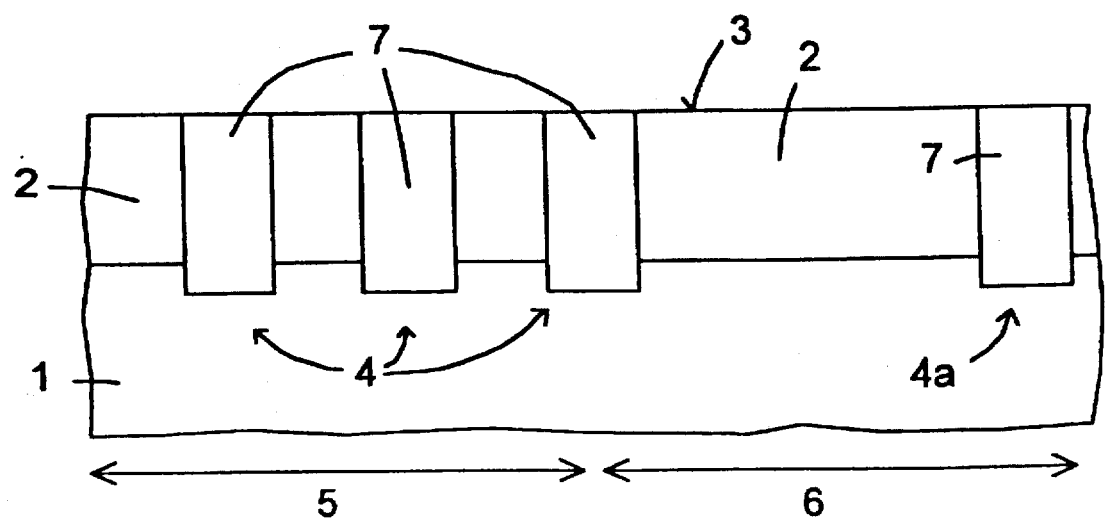
FIG. 2 illustrates the substrate after the production of the insulation trenches.

Trenches 4 are etched in an anisotropic dry-etching method (see FIG. 2), using a trench mask which is applied to the main surface 3 and is not illustrated, for the sake of clarity. The trenches 4 run in the form of strips over the main surface 3 in that part of the substrate 1 in which a cell field 5 will be formed later. The trenches 4 have a depth of, for example, 0.5 to 1 µm. The trenches 4 extend into the n-doped substrate 1. Parallel to the main surface 3, the trenches 4 have a width of one minimum structure size F, for example 0.6 µm, and a length of, for example, 100 µm. For example, 16,000 trenches are arranged parallel alongside one another in the region of the cell field 5. The distance between adjacent trenches 4 is once again one minimum structure size, for example 0.6 µm.

A periphery 6 will be formed later in the substrate, outside the cell field 5. Trenches 4a are likewise produced in the area of the periphery 6 during the trench etching and are used later for insulation of circuit parts which are to be produced in the periphery 6.

The trenches 4, 4a are then filled with insulating material. This is done, for example, by carrying out thermal oxidation at 900° C., during which an SiO$_2$ layer is produced, with a thickness of approximately 40 nm. A further SiO$_2$ layer is then deposited, with essentially conformal edge covering, using a TEOS method. The further SiO$_2$ layer is deposited with a thickness such that the trenches 4, 4a are completely filled. The further SiO$_2$ layer and the SiO$_2$ layer are then etched back using an etching method which is selective with respect to silicon, for example with CHF$_3$, CF$_4$, Ar, until the surface of the first doped region 2 is exposed. In this way, the trenches 4, 4a are filled with trench insulation 7 of SiO$_2$.

Figure 3:
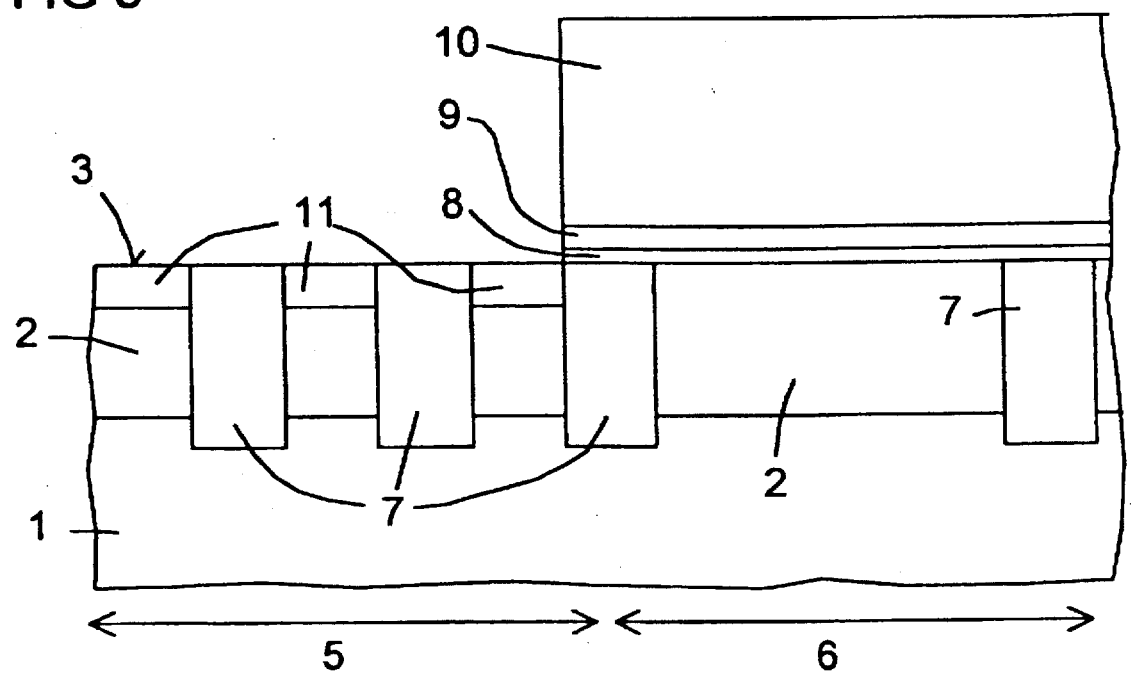
FIG. 3 illustrates the substrate with a mask which covers a region for a periphery.

As illustrated in FIG. 3, a thin SiO$_2$ layer 8 and an Si$_3$N$_4$ layer 9 are then applied to the main surface 3, over the entire area. The SiO$_2$ layer 8 is produced with a thickness of, for example, 20 nm, and the Si$_3$N$_4$ layer 9 with a thickness of, for example 100 nm. A mask 10 is produced, for example, from photoresist and covers the periphery 6, while the cell field remains uncovered by the mask 10. The Si$_3$N$_4$ layer 9 and the SiO$_2$ layer 8 are structured, using the mask 10 as an etching mask, in an anisotropic dry-etching process, so that the main surface 3 is exposed in the area of the cell field 5.

A second doped region 11, which is in the form of a strip and is n$^+$-doped with a dopant concentration of $10^{21}$ cm$^{-3}$, is in each case produced between the trench insulations 7 by implantation with arsenic with an implantation energy of 50 keV and a dose of $5 \times 10^{15}$ cm$^{-2}$. The depth of the second doped region 11 at right angles to the main surface 3 is in each case approximately 0.2 µm (see FIG. 3).

Figure 4:
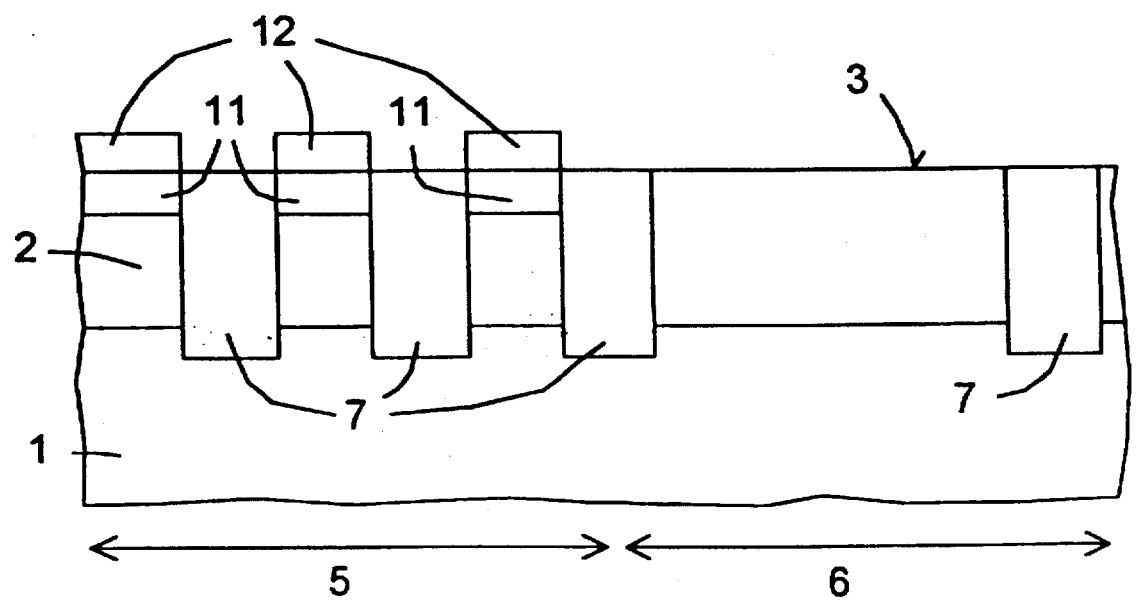
FIG. 4 illustrates the substrate after the formation of a second doped region and of an insulating layer on the surface of the second doped region.

After removal of the mask 10, thermal oxidation is carried out at 850° C. in a moist atmosphere. In so doing, an insulating layer 12 of SiO$_2$ is produced, in a self-adjusting manner, on the surface of the second doped regions 11. The insulating layer 12 has a thickness of approximately 400 nm (see FIG. 4).

In order to improve the planar nature in the cell field 5, silicon etching, which is selective with respect to SiO$_2$, can be carried out using, for example, HBr, Cl$_2$, He, before the implantation for formation of the second doped regions 11. In this case, the height of the first doped region 2 in the cell field is reduced by approximately half the thickness of the insulating layer 12 which is to be produced later. During the thermal oxidation for self-adjusted formation of the insulating layer 12 on the surface of the second doped regions 11, the step which is produced while etching back is then compensated for by the swelling of the material during the oxidation, so that a planar surface is achieved in the cell field 5. For clarity, these steps are not illustrated in detail.

After the formation of the insulating layer 12, the silicon nitride layer 9 and the SiO$_2$ layer 8 are removed in the periphery 6, for example using CHF$_3$, O$_2$ or CHF$_3$, CF$_4$, Ar.

Figure 5:
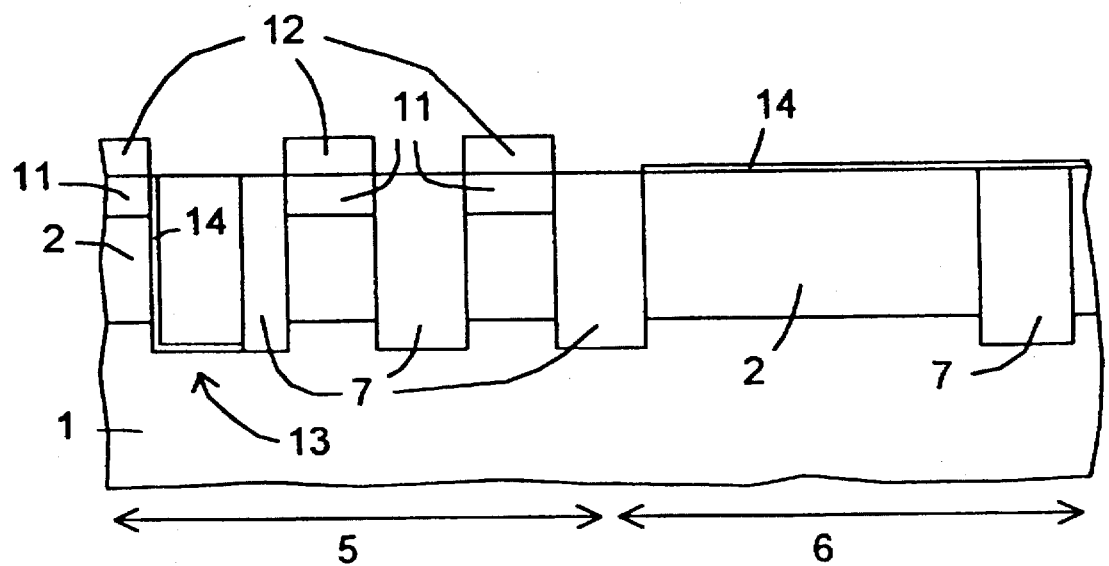
FIG. 5 illustrates the substrate after the opening of holes for vertical MOS transistors and after the formation of a gate oxide.

Referring to FIG. 5, a mask is produced which completely covers the periphery 6 and defines the location for holes 13 in the cell field. The holes 13, which in each case abut a trench insulation 7 and partially overlap the insulation, are then etched in an anisotropic etching process, for example using Ar. The cell field 5 is programed in this etching process. Parallel to the main surface 3, the holes 13 have an essentially square cross-section with a side length of one minimum structure size F, for example 0.6 µm. The holes 13 are arranged offset by F/2 with respect to the center of the respectively adjacent trench insulation. Use is, in this case, made of the fact that, in present-day technologies, the adjustment accuracy is always better than the minimum structure size F. The holes 13 extend into the n-doped substrate 1 and have a depth of, for example 1 µm.

After removal of the mask, thermal oxidation is carried out at, for example, 750° C. In doing so, a gate oxide 14 is produced on exposed silicon surfaces. The gate oxide 14 is, in this case, produced both on the exposed silicon surfaces which form the flanks and the base of the holes 13 and in the periphery 6, on the exposed surface of the first doped region 2. As a result of the different doping, the gate oxide 14 in the holes 13 on the surface of the first doped region 2 grows with less thickness than on the surface of the substrate 1 and of the second doped region 11. The gate oxide 14 is produced with a thickness of, for example, 15 nm on the surface of the first doped region 2, and with a thickness of approximately 30 nm on the surface of the substrate 1 and of the second doped region 11 (see FIG. 5).

Implantation with, for example, boron is carried out. In this case, the implantation energy is, for example, 25 keV and the dose, is for example, $1 \times 10^{12}$ cm$^{-2}$. The operating voltage of MOS transistors which are to be produced subsequently in the periphery 6 is set by this implantation.

Figure 6:
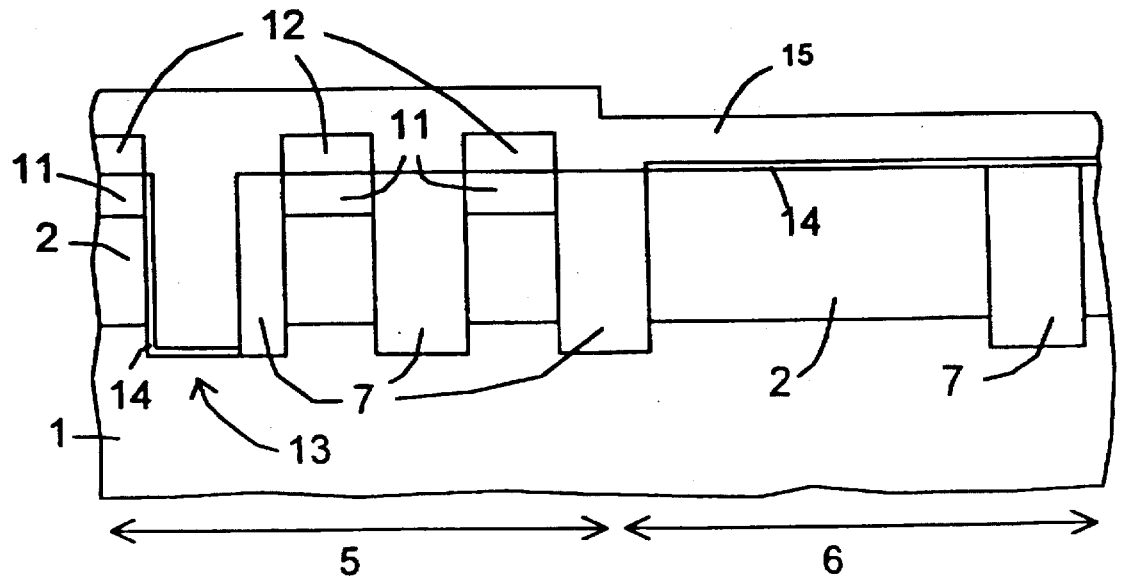
FIG. 6 illustrates the substrate after production of a doped polysilicon layer.

A conductive layer 15 of, for example, doped polysilicon is then deposited over the entire area. The conductive layer 15 is deposited with essentially conformal edge covering. The thickness of the conductive layer 15 is set such that the holes 13 are completely filled. The deposition of the conductive layer 15 is carried out, for example, using a CVD method with SiH$_4$, phosphorus being added to the process gas as dopant. The conductive layer 15 is deposited with a thickness of, for example, 400 nm (see FIG. 6).

Figure 7:
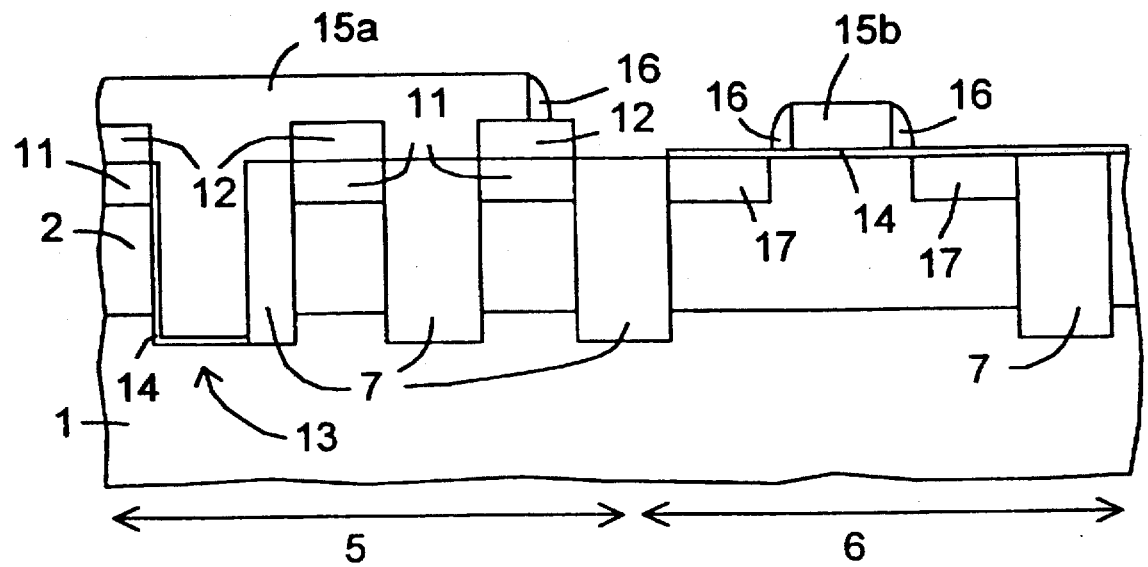
FIG. 7 illustrates the substrate after structuring of the doped polysilicon layer in word lines and gate electrodes for MOS transistors in the periphery, and after production of source/drain regions for the MOS transistors of the periphery.

A photoresist mask (not illustrated) is produced. The conductive layer 15 is structured in an anisotropic etching process for example with HBr, Cl$_2$, using the photoresist mask as an etching mask (see FIG. 7). In so doing, word lines 15a are formed from the conductive layer 15 in the area of the cell field 5. At the same time, gate electrodes 15b for MOS transistors are formed in the area of the periphery 6.

The word lines 15a run transversely with respect to the trench insulations 7. That portion of the word lines 15a which is arranged in the holes 13 forms in each case one gate electrode for the MOS transistor which is formed from the substrate 1, the first doped region 2, the second doped region 11 and the gate dielectric 14 which is arranged on the flank of the respective hole 13. The gate electrodes of these vertical MOS transistors are connected by virtue of the production process to the respective word line 15a.

$SiO_2$ spacers 16 are then produced, by conformal deposition and anisotropic etching of an $SiO_2$ layer on vertical flanks of the word lines 15a and of the gate electrodes 15b, in order to produce lateral MOS transistors in the periphery 6. Source/drain regions 17 are formed in the periphery 6 by implantation with, for example, arsenic with an energy of 50 keV and a dose of $5 \times 10^{15}$ $cm^{-2}$. Since the source/drain regions 17 of the MOS transistors in the periphery 6 are doped by the same conductance type as the gate electrode 15b and the word lines 15a, this implantation can be carried out without an additional mask.

Further method steps, which are known from MOS technology, such as LDD profile, salicide technique and the like, can be carried out for the production of the lateral MOS transistors in the periphery 6.

In order to produce the read-only-memory cell arrangement, a planarizing intermediate-oxide layer of, for example, boron-phosphorus-silicate glass is then deposited over the entire area, and contact holes are opened in it. The contact holes are filled, for example, with tungsten. This is followed by the production of a metallization level, for example by deposition and structuring of an aluminium layer. Finally, a passivation layer is applied. At the same time, the substrate 1 is also provided with a contact. These standard steps are not illustrated in detail.

In the read-only-memory cell arrangement produced according to the invention, the substrate 1, which is n-doped, is used as a common reference line which is connected to the source regions of the vertical MOS transistors in the cell field 5. The first doped region 2 is p-doped, and those parts of it which are in the form of strips and are in each case arranged between adjacent trench insulations 7 are used as the channel region for the vertical MOS transistors. The second doped regions 11, which in each case run in the form of strips between adjacent trench insulations 7, are used as bit lines.

Figure 8:
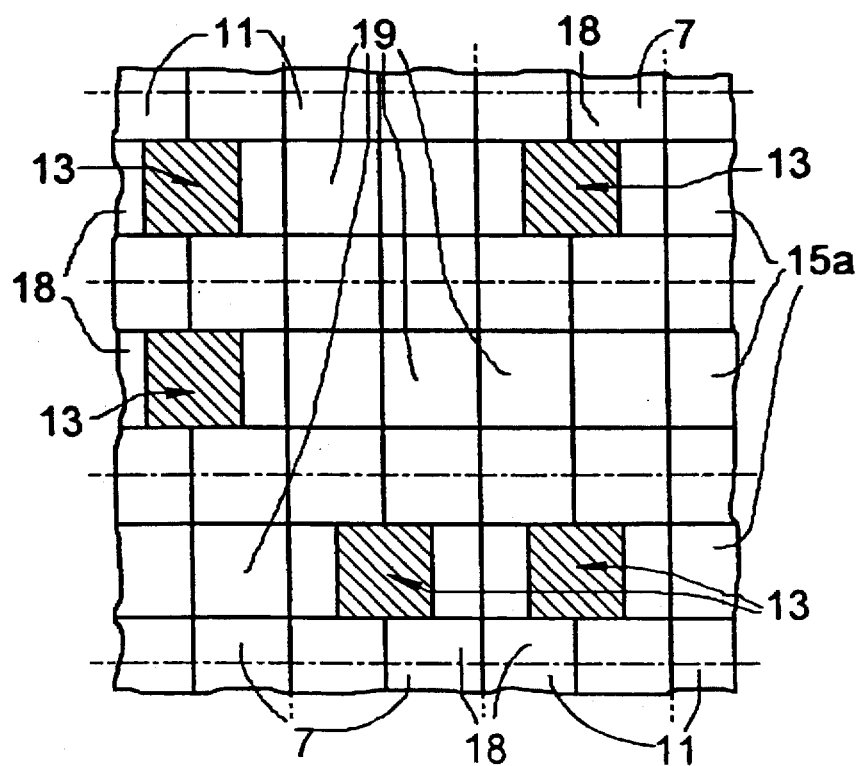
FIG. 8 illustrates a plan view of a cell field of a memory cell arrangement produced in accordance with the method according to the invention.

FIG. 8 shows a plan view of the cell field 5 of the read-only-memory cell arrangement produced according to the invention. The read-only-memory cell arrangement has first memory cells 18 and second memory cells 19 in the cell field 5. The cell sizes of the first memory cells 18 and of the second memory cells 19 are shown as dashed-dotted lines in FIG. 8. A first logic value is, in each case, stored in the first memory cells 18, and a second logic value is stored in the second memory cells 19. The first logic value is written in the first memory cells 18 by a vertical MOS transistor, whose gate electrode is connected to one of the word lines 15a, being formed in the area of the first memory cells 18 by etching of the hole 13 and formation of, the gate oxide 14 and the gate electrode 15b.

The second logic value is written in the second memory cells 19 by no hole being etched in the area of the second memory cells 19 and, in consequence, no vertical MOS transistor being produced in the rest of the production method. The word lines 15a, which run over the second memory cells 19, are thus not connected in the area of the second memory cells 19 through a vertical gate electrode. In consequence, when a second memory cell 19 is selected via the corresponding word line 15a, no current can flow via the corresponding bit line 11.

Seven masks are required in the production method according to the invention, lateral transistors being produced in the periphery 6 at the same time as the cell field 5. The area requirement of the memory cell 18, 19 in this exemplary embodiment is $4\,F^2$ wherein F is the smallest structure size which can be produced using the respective lithography.

Furthermore, it should also be understood that other various changes and modifications to the presently preferred embodiments described herein will be apparent to those skilled in the art. Such changes and modifications may be made without departing from the spirit and scope of the present invention and without diminishing its attendant advantages. Therefore, it is intended that such changes and modifications be covered by the appended claims.

We claim:

1. A method for production of a read-only-memory cell arrangement, the method comprising the steps of:

forming a cell field on a main surface of a semiconductor substrate wherein the cell field has first memory cells in which a first logic value is stored and which comprise at least one MOS transistor which is vertical with respect to the main surface and has second memory cells in which a second logic value is stored and which do not comprise a MOS transistor;

doping the semiconductor substrate by a first conductance type provided with a first doped region which is doped by a second conductance type, opposite to the first, and abuts the main surface in the area of the cell field;

producing a plurality of insulation trenches which run essentially parallel in the form of strips that extend from the main surface through the first doped region into the semiconductor substrate;

producing a second region which is doped by a first conductance type having a shallower depth than the first doped region and abutting the main surface; and opening holes to form vertical MOS transistors wherein the holes extend from the main surface through the first doped region into the semiconductor substrate to overlap the boundary surface between one of the insulation trenches and the adjacent part of the second doped region whose surface is provided with a gate dielectric and a gate electrode.

2. The method of claim 1 further comprising the steps of:

producing the insulation trenches at such intervals and with such widths that the distance between adjacent insulation trenches is essentially equal to the width of the insulation trenches;

producing the holes with a cross-section parallel to the main surface with linear dimensions essentially equal to the width of the insulation trenches; and arranging a center point of the cross-section of the holes offset with respect to a center of the insulation trenches.

3. The method of claim 1 further comprising the step of:

arranging a center point of the cross-section of the holes offset by approximately half the width of the insulation trenches with respect to the center of the insulation trenches.

4. The method of claim 1 further comprising the step of:

etching trenches filled with insulating material in an anisotropic dry-etching process, using a trench mask, for formation of the insulation trenches.

5. The method of claim 4 further comprising the steps of:

providing the surface of the second doped regions with an insulation layer in the cell field;

etching the holes by anisotropic dry etching using a perforated mask;

performing thermal oxidation for formation of the gate oxide; and depositing a conductive layer with essentially conformal edges covering over an entire area for formation of the gate electrode wherein the conductive layer essentially fills the holes and is structured such that work lines are produced which are in the form of strips and run transversely with respect to the insulation trenches.

6. The method of claim 5 further comprising the steps of:

applying a double layer of $SiO_2$ and $Si_3N_4$ to the main surface over the entire area;

removing the double layer in the region of the cell field after the implantation for formation of the second doped region;

forming the insulating layer on the surface of the second doped regions by thermal oxidation wherein any oxidation of the surface outside of the cell field is prevented by the double layer; and removing the double layer after the formation of the insulating layer.

7. The method as claimed in claim 6 further comprising the step of:

performing etching that attacks silicon selectively with respect to $SiO_2$ in the region of the cell before the application of the double layer.

8. The method as claimed in claim 5 further comprising the steps of:

forming a gate oxide layer for MOS transistors formed in a periphery outside the cell field during thermal oxidation for formation of the gate oxide; and structuring the conductive layer such that hate electrodes for the MOS transistors are formed at the same time in the periphery.

9. The method as claimed in claim 8 further comprising the steps of:

providing flanks of the gate electrodes of the MOS transistors in the periphery with flank insulations; and forming source-drain regions for the MOS transistors in the periphery by implantation wherein the gate electrodes which are provided with the flank insulations are used as a mask.

* * * * *